United States Patent [19]
Usami et al.

[11] Patent Number: 6,157,083
[45] Date of Patent: *Dec. 5, 2000

[54] FLUORINE DOPING CONCENTRATIONS IN A MULTI-STRUCTURE SEMICONDUCTOR DEVICE

[75] Inventors: Tatsuya Usami; Hiraku Ishikawa, both of Tokyo, Japan

[73] Assignee: NEC Corporation, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/864,388

[22] Filed: May 28, 1997

[30] Foreign Application Priority Data

Jun. 3, 1996 [JP] Japan .................................. 8-140003

[51] Int. Cl.[7] .......................... H01L 23/48; H01L 23/52; H01L 29/40
[52] U.S. Cl. .......................... 257/760; 257/752; 257/635
[58] Field of Search .................................... 257/734, 635, 257/750, 751, 760, 758, 752, 637; 438/631, 699, 624

[56] References Cited

U.S. PATENT DOCUMENTS

| | | | |
|---|---|---|---|
| 5,334,552 | 8/1994 | Homma | 257/760 |
| 5,399,529 | 3/1995 | Homma | 438/631 |
| 5,429,995 | 7/1995 | Nishiyama et al. | 437/238 |
| 5,571,578 | 11/1996 | Kaji et al. | 427/579 |
| 5,578,531 | 11/1996 | Kodera et al. | 438/699 |
| 5,646,440 | 7/1997 | Hasegawa | 257/635 |
| 5,753,975 | 5/1998 | Matsuno | 257/751 |

FOREIGN PATENT DOCUMENTS

| | | |
|---|---|---|
| 0496543 | 1/1992 | European Pat. Off. . |
| 0599730 | 11/1993 | European Pat. Off. . |
| 63-33919 | 12/1994 | Japan . |
| 7-93275 | 10/1995 | Japan . |
| 2306778 | 5/1997 | United Kingdom . |

OTHER PUBLICATIONS

Hayasaka et al; "Fluorine Doped SiO2 for Low Dielectric Constant Films in Sub–Half Micron ULSI Multilevel Interconnection"; 1995; pp. 157–159; Extended Abstracts of the 1995 International Conference on Solid State Devices and Materials, Osaka.

*Primary Examiner*—Olik Chaudhuri
*Assistant Examiner*—Phat X. Cao
*Attorney, Agent, or Firm*—Hayes, Soloway, Hennessey, Grossman & Hage, P.C.

[57] ABSTRACT

A semiconductor device is manufactured by forming a first fluorine doped plasma silicon oxide film having a high fluorine concentration on first metallic interconnections formed on a semiconductor substrate surface, forming a second fluorine doped plasma silicon oxide film having a low fluorine concentrations on the first film, and carrying out chemical machine polishing (CMP) only on the second fluorine doped plasma silicon oxide film.

6 Claims, 6 Drawing Sheets

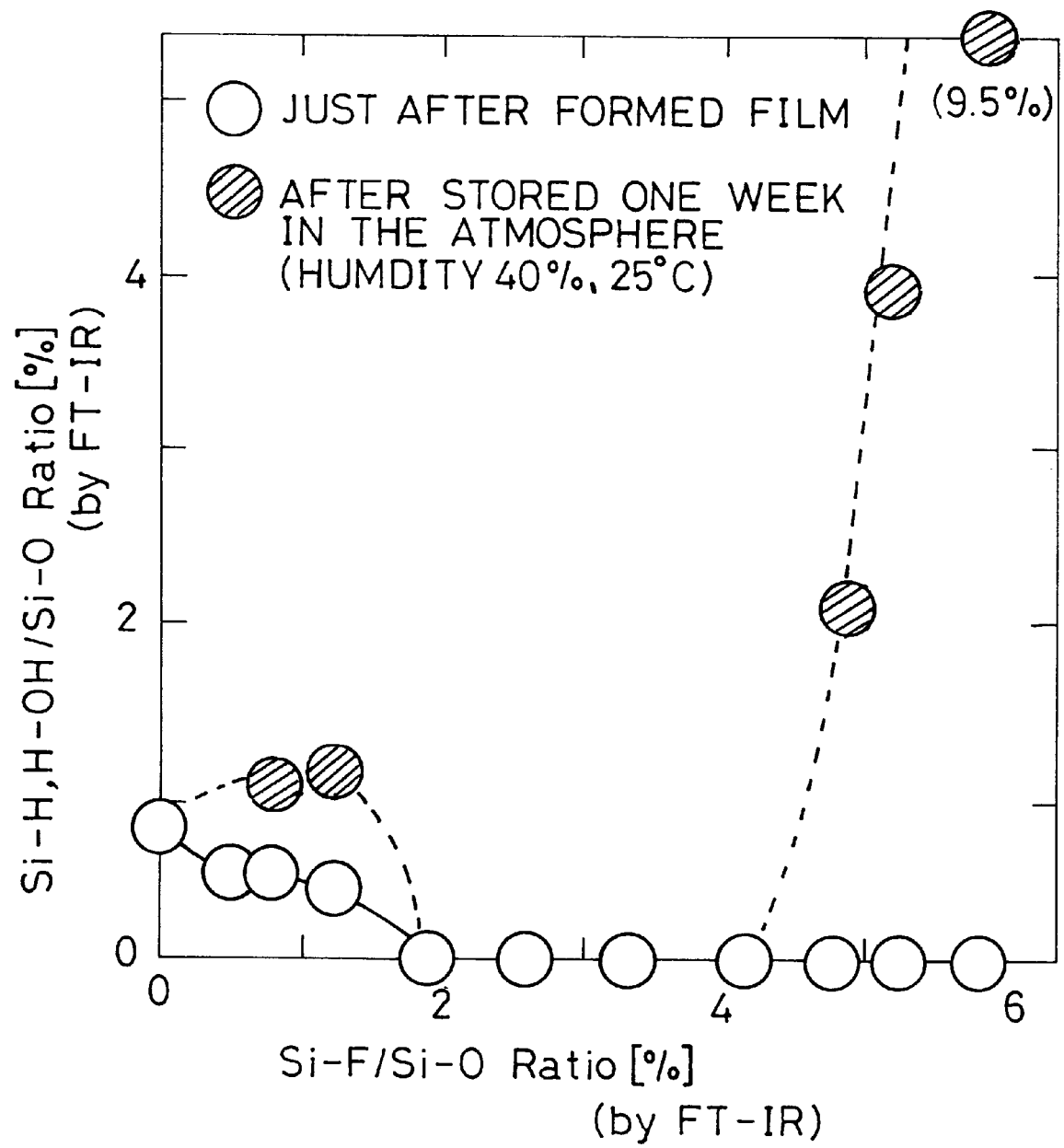

FLUORINE DOPING CONCENTRATIONS IN A MULTI-STRUCTURE SEMICONDUCTOR DEVICE

BACKGROUND OF THE INVENTION

1. Field of the Invention

The present invention relates to a semiconductor device and a method for manufacturing the same, and more specifically, it relates to a semiconductor device having an insulating film and an interfacial insulating film, and a method for manufacturing the same.

2. Description of the Related Art

In recent years, with regard to semiconductor integrated circuits, their miniaturization has been advanced, particularly as for multilayer interconnections in logic circuits. When spaces between metals of the multilayer interconnections are fine, capacitance between adjacent interconnections increases, which leads to the deterioration of electric signal speed and which also gives rise to crosstalk (which is a phenomenon that another signal functions as noise).

As one means for preventing the above-mentioned problem, there has been adopted the practice of lowering the dielectric constant of the insulating film between metal layers, and nowadays, much attention has been paid to the change from a silicon oxide film formed by a conventional plasma CVD method (the dielectric constant=4.3) (hereinafter referred to as "the p-SiO$_2$ film") to a fluorine doped plasma silicon oxide film (the dielectric constant=2.8 to 4.3) (hereinafter referred to as "the p-SiOF film").

When fluorine concentration in the p-SiOF film is increased, its dielectric constant can be lowered, but if the fluorine concentration is excessively increased, its moisture resistance deteriorates. Therefore, at fluorine concentrations that the moisture resistance does not deteriorate, the dielectric constant cannot sufficiently be lowered (the dielectric constant=about 3.3).

In order to solve the above-mentioned problem, the prior art has proposed increasing the density of a plasma itself, see for example, SSDM, p. 157 (1995).

While this suggested technique can increase the fluorine concentration more than a conventional technique, when the fluorine concentration reaches a certain level, deterioration of the film occurs. For this reason, the dielectric constant cannot be lowered significantly.

When a p-SiOF film is used in a device, it is essential to flatten the film; however, if a chemical machine polishing method (hereinafter referred to as "CMP") is used for flattening the P-SiOF film, the above-mentioned problem of deterioration of moisture resistance occurs. As a consequence, when CMP is used, further increase of the dielectric constant cannot be avoided.

As described above, the employment of CMP in a p-SiOF process heretofore presented problems.

Two conventional examples using CMP will be described.

In one conventional example, a p-SiOF film is directly formed on a metal as shown in FIG. 3. For example, as described in Japanese Patent Application Laid-open No. 333919/1994, a first metal 301 is formed, and a p-SiOF film 302 having a dielectric constant of 3.0 and a fluorine concentration of 7×10$^{21}$ atoms/cc in the wafer surface is then formed thereon by the use of three gases of SiF$_4$, O$_2$ and Ar in accordance with an ECR-CVD method If CMP is carried out to flatten this film, the film absorbs water, so that the dielectric constant of the film increases.

In a worse case, a large amount of introduced fluorine (F) whose bond is weak reacts with H$_2$O to produce HF, with the result that corrosion of the metal and dissolution of the metal takes place. Here, reference will be made to a case where a fluorine concentration is lowered to about 1.0×10$^{21}$ atoms/cc.

After CMP processing, the film is as shown in FIG. 3(B). Next, the film is coated with a photoresist, and alignment exposure is then carried out to pattern the photoresist. Afterward, an etching technique, i.e., a magnetron RIE technique using C$_4$F$_8$ CO and an Ar gas is utilized to form holes.

Furthermore, after the formation of TiN, blanket WCVD is carried out to form a metal via 303 by a process which is called etch back. Afterward, continuous sputtering of a second metal 304 such as AlCu—TiN is done, and it is then patterned by the photoresist This serial operation is carried out once or more to form multilayer interconnections as shown in FIG. 3(c).

A problem of this process is that when the fluorine concentration in the p-SiOF film is high, the film absorbs moisture during CMP processing of the film and when the fluorine concentration in the film is low, dielectric constant increases.

In a next example, an SiO$_2$ film is sandwiched between upper and lower p-SiOF films to inhibit the hygroscopicity of the p-SiOF films. In Japanese Patent Application Laid-open No. 9372/1995, there has been described an SiOF film formed in a tetraethoxy orthosilicate system (hereinafter referred to as "the TEOS system"), and therefore, description will be made with reference to this technique. FIG. 4 shows its flow diagram.

According to the suggested method, after the formation of a first metal 401, a first p-SiO$_2$ film 402 is formed, and a TEOS system material with which a fluorine containing gas is mixed is then used to form a fluorine doped SiO$_2$ film (a p-SiOF film 403). Afterward, a second p-SiO$_2$ film 404 is formed thereon.

Here, the plasma SiOF film is formed by a high density plasma CVD method which is preferred for moisture resistance, particularly a plasma SiO$_2$ film high density plasma CVD method.

In a conventional example, parallel plate type plasma CVD has been used, but in this example, the laminated film is formed by a high density plasma CVD method.

Here, fluorine concentration in the SiOF film is 1021 atoms/cc. After the first metal 401 has been formed, the continuous growth of SiO$_2$/SiOF/SiO$_2$ is carried out by high density plasma CVD, whereby a structure as shown in FIG. 4(a) or FIG. 4(aa) is obtained. In the case that the p-SiOF film 403 which is an intermediate layer is relatively thick as shown in FIG. 4(a), the p-SiOF film 403 is exposed as in FIG. 4(b), after the CMP processing has been made. Although the p-SiOF film has already been sandwiched between the p-SiO$_2$ films in order to control the hygroscopicity of the p-SiOF, the p-SiOF film 403 is exposed, and as a result, the film absorbs water during the CMP processing. In consequence, the dielectric constant of the film increases inconveniently.

In order to avoid the above-mentioned problems, the p-SiOF film 403 can be formed relatively thin and the second SiO$_2$ film 404 can be formed relatively thick as in FIG. 4(aa), and in such case, the p-SiOF film 403 will not be not exposed after CMP processing, as shown in FIG. 4(bb). In such case, however, the p-SiO$_2$ film may invade the adjacent metal layer, so that increase of the dielectric constant occurs.

Afterward, as in the above-mentioned example, the hole via formation, the via metal formation and the second metal formation are done in this order, so that multilayer interconnections may be formed as in FIG. 4(c) or FIG. 4(cc).

FIG. 5 shows the relation between fluorine content in the fluorine-doped silicon oxide film and the dielectric constant in the case where high density plasma CVD is used, and FIG. 6 shows the relation between the fluorine content in fluorine doped silicone oxide film and hygroscopicity in the case where high density plasma CVD is used (Semiconductor Integrated Circuit Symposium Manuscript in 1995, p. 45). These drawings illustrate the relationship between fluorine content in the silicon oxide film and dielectric constant and the relationship between fluorine content and hygroscopicity. The actual values of fluorine content and these characteristics may depend slightly on the actual selected device, and so they are not always constant, but these drawings still show the influence of fluorine content in the silicon oxide film on dielectric constant and hygroscopicity.

The first problem is that in both of the above examples, as dielectric constant increases, the via holes become abnormal and metal corrosion occurs, when the p-SiOF film having a low dielectric constant is subjected to the CMP processing. This reason is that the p-SiOF film having low dielectric constant absorbs water when exposed to water, so that dielectric constant increases and the resistance of the via holes become abnormal, and the absorbed water reacts with fluorine to bring about metal corrosion.

The second problem is that when the p-SiOF film which is the intermediate of the $SiO_2/SiOF/SiO_2$ structure is formed relatively thin so as to solve the first problem of the second example, the dielectric constant between the metallic layers increases. This reason is that a ratio of $p-SiO_2$ occupied between the metallic layer is relatively high.

Objects of the present invention are to prevent the increase of capacitance between layers in a mulitilayer interconnection structure of a semiconductor integrated circuit (the lowering of the dielectric constant) and to improve reliability by minimizing via hole resistance.

SUMMARY OF THE INVENTION

The present invention provides a semiconductor device which comprises a plurality of interconnections formed on a semiconductor substrate, a first fluorine doped silicon oxide film for filling up spaces between the plurality of interconnections, and a second fluorine doped silicon oxide film which is formed on the first fluorine doped silicon oxide film and which has a flattened surface and which is free from hygroscopicity.

This application is based on application No. Heisei 8-140003/1996 filed Jun. 3, 1996 in Japan, the contents of which are incorporated herein by reference.

BRIEF DESCRIPTION OF THE DRAWINGS

For a more complete understanding of this invention, reference may be had to the following detailed description with reference to the accompanying drawings in which:

FIG. 6 shows the relationship between fluorine content in a fluorine doped silicon oxide film and hygroscopicity.

Figure 1:
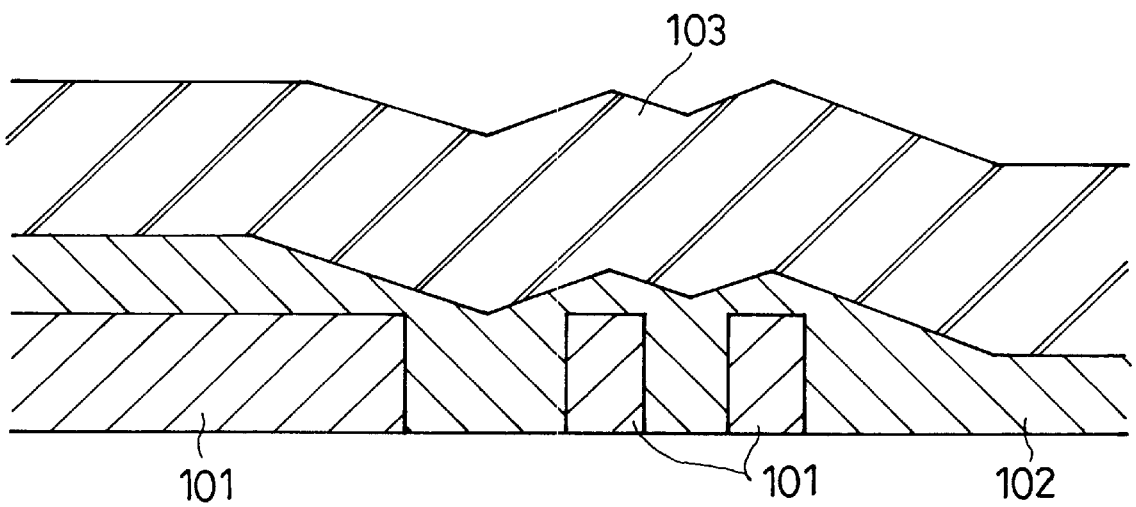
FIG. 1 is a process flow diagram of a first example of the present invention.
Figure 1:
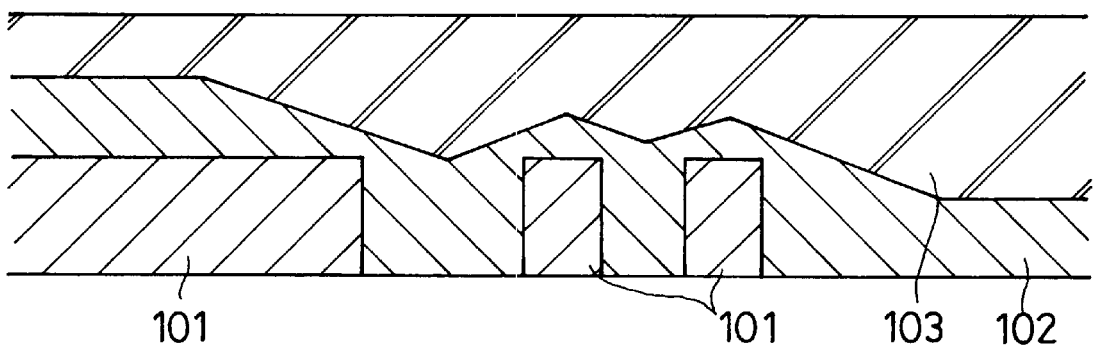

Symbols used in FIGS. 1 to 6 represent the following members.

101 . . . First metal
102 . . . First p-SiOF film
103 . . . Second p-SiOF film
104 . . . Via metal
105 . . . second metal
201 . . . First metal
202 . . . First $p-SiO_2$ film
203 . . . First p-SiOF film
204 . . . second p-SiOF film
205 . . . second $p-SiO_2$ film
206 . . . Via metal
207 . . . second metal
301 . . . First metal
302 . . . p-SiOF film
303 . . . Via metal
304 . . . Second metal
401 . . . First metal
402 . . . First $p-SiO_2$ film
403 . . . p-SiOF film
404 . . . second $p-SiO_2$ film
405 . . . Via metal
406 . . . second metal

DESCRIPTION OF THE PREFERRED EMBODIMENTS

The present invention includes the following embodiments (1) A semiconductor device which comprises a plurality of interconnections formed on a semiconductor substrate, a first fluorine doped silicon oxide film for filling up spaces between the plurality of interconnections, and a second fluorine doped silicon oxide film which is formed on the first fluorine doped silicon oxide film and which has a flattened surface and which is free from hygroscopicity.

(2) A semiconductor device which comprises a plurality of interconnections formed on a semiconductor substrate, a first silicon oxide film formed on the interconnections, a first fluorine doped silicon oxide film formed on the first silicon oxide film, a second fluorine doped silicon oxide film which is formed on the first fluorine doped silicon oxide film and which has a flattened surface and which is free from hygroscopicity, and a second silicon oxide film formed on the second fluorine doped silicon oxide film.

(3) The semiconductor device according to the above-mentioned paragraph (1) or (2) wherein a dielectric constant of the first fluorine doped silicon oxide film is 3.3 or less.

(4) The semiconductor device according to the above-mentioned paragraph (1) or (2) wherein a dielectric constant of the second fluorine doped silicon oxide film is in excess of 3.3.

(5) The semiconductor device according to (1) or (2) wherein a fluorine concentration of the first fluorine doped silicon oxide is $4.0 \times 10^{21}$ atoms/cc or more.

(6) The semiconductor device according to (1) or (2) wherein a fluorine concentration of the second fluorine doped silicon oxide is less than $4.0 \times 10^{21}$ atoms/cc.

(7) A method for manufacturing a semiconductor device which comprises a step of forming interconnections on a semiconductor substrate, a step of forming a first fluorine doped silicon oxide film, a step of forming a second fluorine doped silicon oxide film which is free from hygroscopicity, and a step of carrying out chemical machine polishing only on the surface of the second fluorine doped silicon oxide film to flatten the surface.

(8) A method for manufacturing a semiconductor device which comprises a step of forming interconnections on a semiconductor substrate, a step of forming a first silicon oxide film, a step of forming a first fluorine doped silicon oxide film, a step of forming a second fluorine doped silicon oxide film which is free from hygroscopicity, a step of carrying out chemical machine polishing only on the surface of the second fluorine doped silicon oxide film to flatten the surface, and a step of forming a second silicon oxide film.

(9) The method for manufacturing a semiconductor device according to the above-mentioned paragraph (7) or (8) wherein the first silicon oxide film and the second silicon oxide film are plasma silicon oxide films.

(10) The method for manufacturing a semiconductor device according to the abovementioned paragraph (7) or (8) wherein the first fluorine doped silicon oxide film and the second fluorine doped silicon oxide film are high density plasma silicon oxide films.

(11) The method for manufacturing a semiconductor device according to the above-mentioned paragraph (7) or (8) wherein the first fluorine doped silicon oxide film and the second fluorine doped silicon oxide film are high density plasma silicon oxide films continuously formed.

A semiconductor device and a method for manufacturing the semiconductor device of the present invention are characterized by carrying out a serial operation one or more times which comprises a step of forming a first fluorine doped plasma silicon oxide film having a high fluorine concentration on first metallic interconnections formed on a semiconductor substrate surface, a step of forming a second fluorine doped plasma silicon oxide film having a low fluorine concentration, a step of carrying out chemical machine polishing only on the second fluorine doped plasma silicon oxide film, a step of forming a hole at a desired position, a step of filling the hole with a metal, and a step of forming second metallic interconnections (FIG. 1). Furthermore, it can be presumed that adhesive properties in an interface are poor or an unwanted reaction occurs, depending on a kind of metal or a kind of plasma SiOF film. In this case, the present invention is characterized carrying out a serial operation one or more times which comprises a step of forming a first plasma silicon oxide film on already formed first metallic interconnections, forming a first p-SiOF film, forming a second p-SiOF film, and then carrying out CMP processing only on the second p-SiOF film, a step of forming a second p-SiO$_2$ thereon a step of forming a hole at a desired position, a step of filling the hole with a metal, and a step of forming second metallic interconnections (FIG. 2).

In the present invention, in order to decrease capacitance between the interconnections, at least spaces between the interconnections are filled up with a fluorine doped silicon oxide film whose dielectric constant is less than the silicon oxide film, and on its surface, there is formed a fluorine doped silicon oxide film which is free from hygroscopicity and which has a relatively high dielectric constant. In consequence, even if CMP processing is employed, the increase of dielectric constant due to hygroscopic phenomenon does not occur. Furthermore, even in a subsequent via hole formation step, the fluorine doped silicon oxide film which is the upper layer hardly exhibits any hygroscopicity, so that the defect of via hole resistance increase does not occur.

Next, the present invention will be described in more detail with reference to drawings.

Referring to FIG. 1, a first embodiment of the present invention will be described. As shown in FIG. 1(a), a first p-SiOF film 102 having a thickness of 5000 Å was formed on a first metal 101 by a bias ECR-CVD method, and a second p-SiOF film 103 having a thickness of 10000 Å was further formed thereon. Here, the second p-SiOF film 103 had a fluorine concentration of less than $4.0 \times 10^{21}$ atoms/cc, and the first p-SiOF film 102 which was formed under the film 103 had, in its wafer surface, a fluorine concentration of $4.0 \times 10^{21}$ atoms/cc which was higher than that of the second p-SiOF film. This plasma SiOF/SiO$_2$ laminate structure is preferably grown in a continuous manner, because burying properties are good. However, in the case that a problem regarding an operating efficiency of a high density plasma CVD method or another problem is present, these films may be separately grown.

Afterward, CMP processing was carried out to polish the second p-SiOF film alone as much as about 4000 Å as shown in FIG. 1(b). It was confirmed by our experiments that the second plasma SiOF film did not absorb moisture at this fluorine concentration. Afterward, a photoresist was applied onto this film 103, followed by alignment and exposure to pattern the photoresist. Next, holes were made through the two p-SiOF films by a magnetron RIE technique using $C_4F_8$, CO and Ar gases.

Furthermore, a barrier layer of TiN was formed, and a tungsten member was then formed by a blanket WCVD method to accomplish etch back, thereby forming a via metal 104.

Figure 1C:
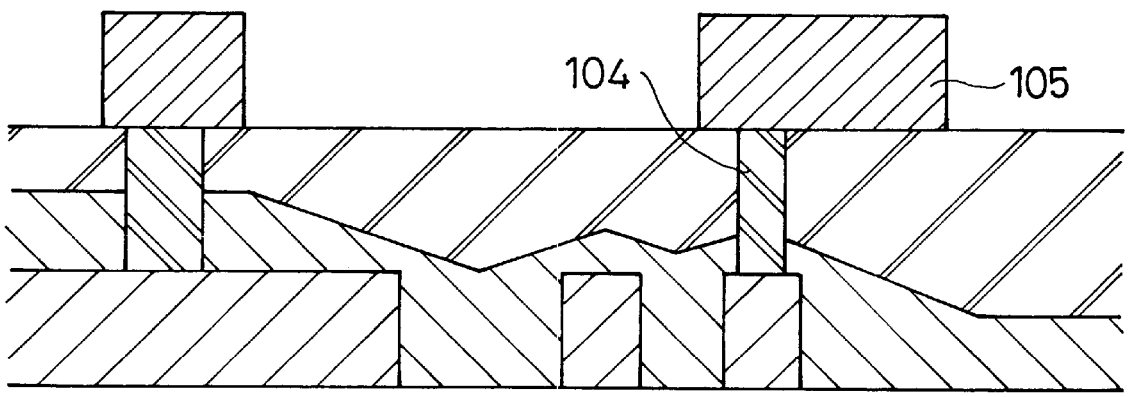

Afterward, continuous sputtering of a second metal 105 of, for example, AlCu—TiN was carried out, and this metal was patterned through a photoresist. This serial procedure was carried out one or more times to form multilayer interconnections as shown in FIG. 1(c).

Following the above-mentioned process capacitance between the metal layers could be decreased and flattening of the film could be achieved, whereby the multilayer interconnections could be attained. In this connection, dielectric constants of the first fluorine doped silicon oxide film and the second fluorine doped silicon oxide film in this embodiment were 3.0 and 3.5, respectively.

Next, a second embodiment will be described in detail with reference to FIG. 2.

In the first embodiment, the p-SiOF film is directly formed on the metal, but when adhesive properties between the metal and the p-SiOF film are poor or unwanted reaction of the metal and the p-SiOF occurs, depending on the kind of metal or the kind of SiOF film, it is desirable to use the following second embodiment.

Figure 2A:
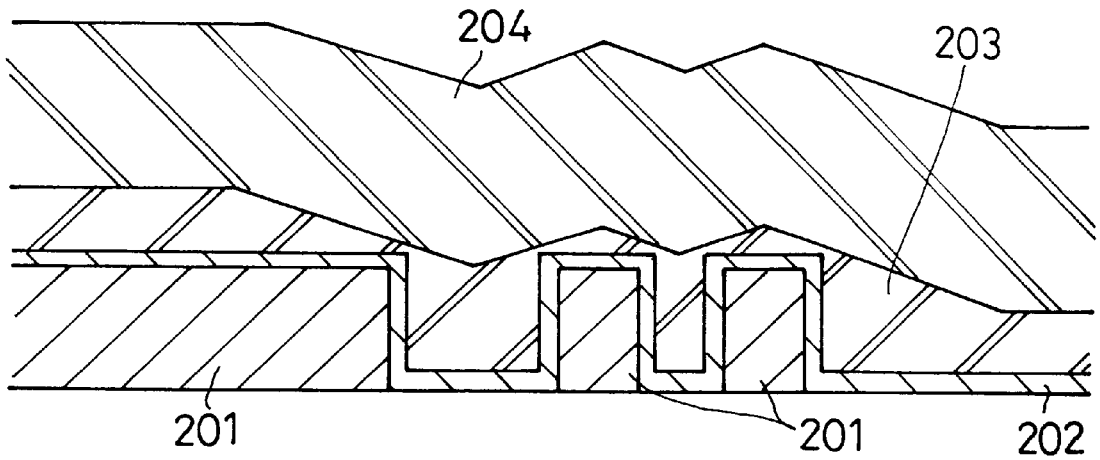
FIG. 2 is a process flow diagram of a second example of the present invention.

As shown in FIG. 2(a), a first p-SiO$_2$ film 202 having a thickness of 1000 Å, a first p-SiOF film 203 having a thickness of 4000 Å and a second p-SiOF film 204 having a thickness of 10000 Å were grown on a first metal 201 by a bias ECR-CVD method.

A fluorine concentration of the second p-SiOF film 204 was less than $4.0 \times 10^{21}$ atoms/cc, and a fluorine concentration of the first p-SiOF film 203 formed thereunder was $4.0 \times 10^{21}$ atoms/cc or more in a part or all of its wafer surface.

Afterward, CMP processing was carried out to polish the second plasma p-SiOF film 204 alone as much as about 4000

Å. It was confirmed by our experiments that the second plasma SiOF film did not absorb moisture at this fluorine concentration.

Figure 2B:
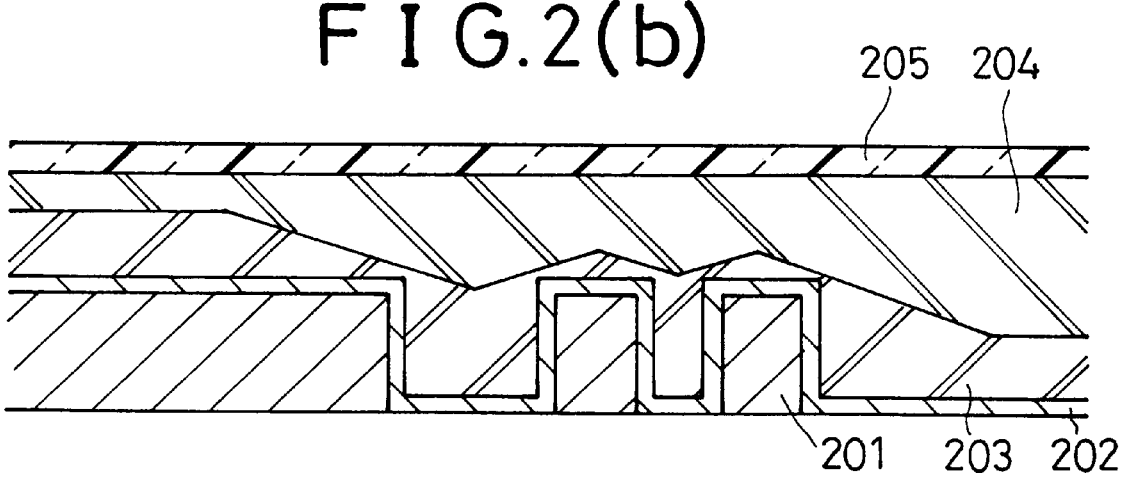

On this film, a second p-SiO$_2$ film 205 was grown to a thickness of about 2000 Å [FIG. 2(b)].

Afterward, a photoresist was applied onto this film 205, followed by alignment and exposure to pattern the photoresist. Next, holes were made through the laminate film of SiO$_2$/two SiOF films/SiO$_2$ by a magnetron RIE technique using C$_4$F$_8$, CO and Ar gases. Furthermore, as in the first embodiment, a TiN film was formed, and blanket W-CVD was then employed to accomplish etch back, thereby forming a via metal 206.

Figure 2C:
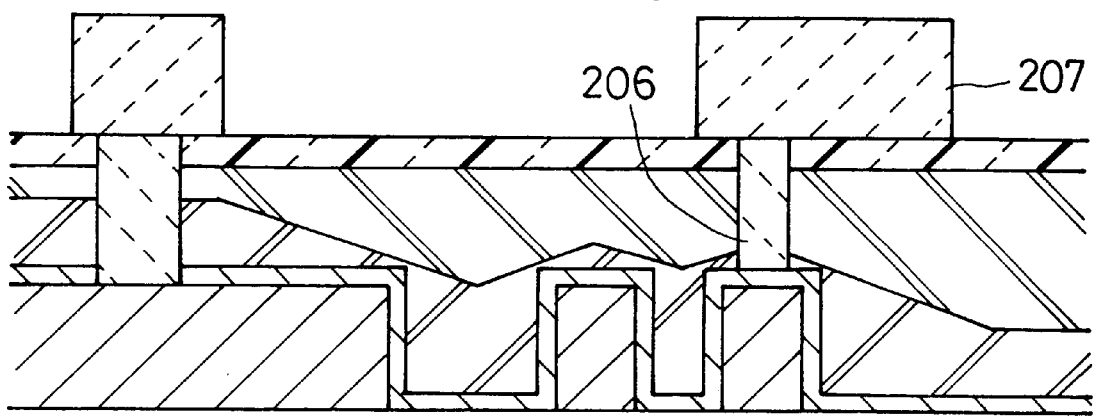
Figure 3A:
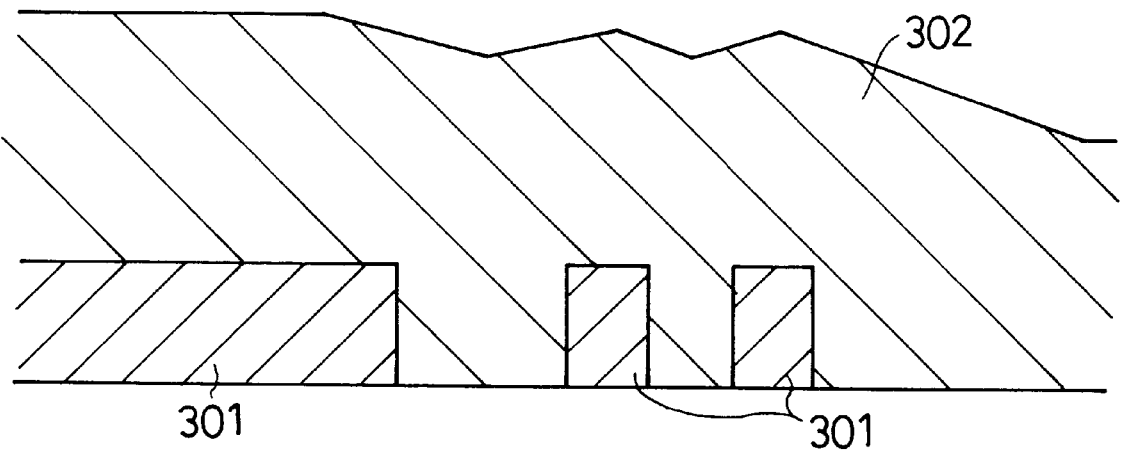
FIG. 3 is a process flow diagram of a first example of a conventional technique.
Figure 3B:
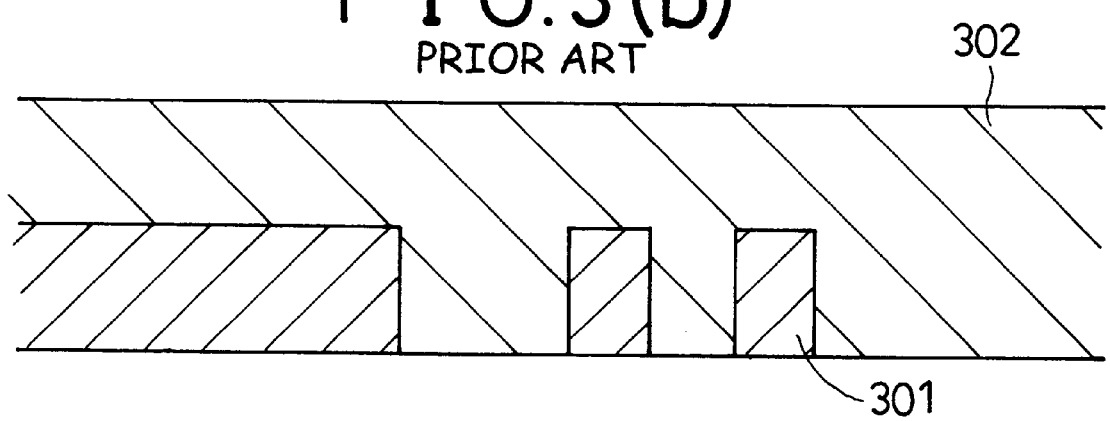
Figure 3C:
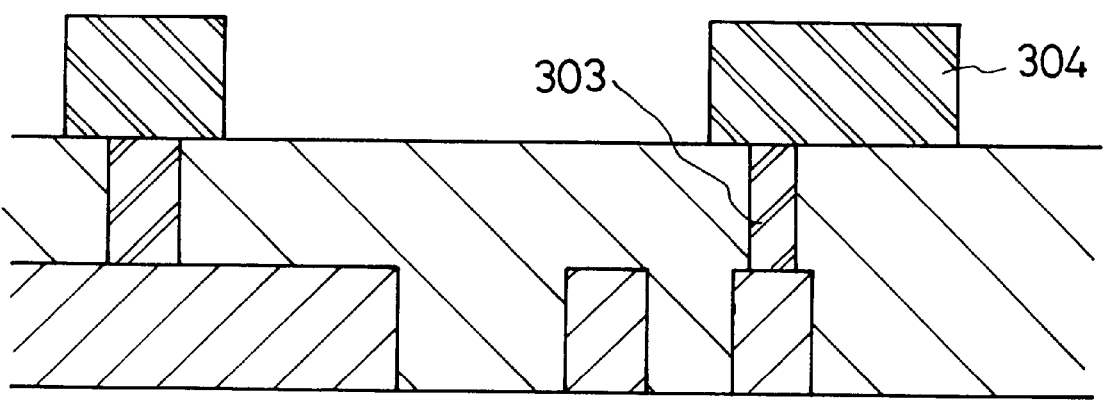
Figure 4A:
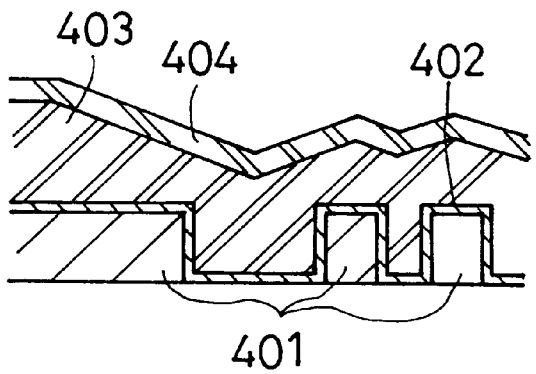
FIG. 4 is a process flow diagram of a second example of the conventional technique.
Figure 4:
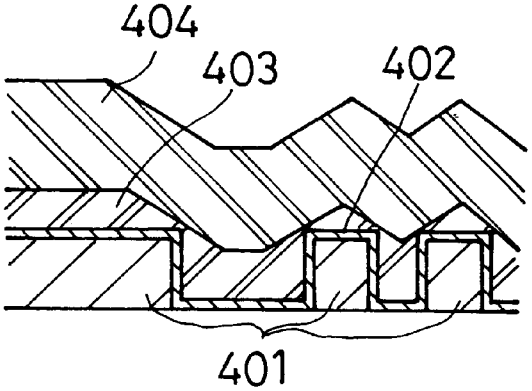
Figure 4B:
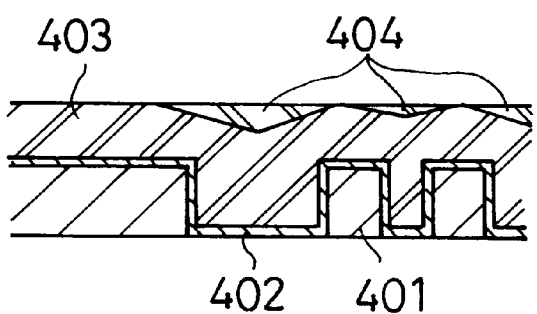
Figure 4:
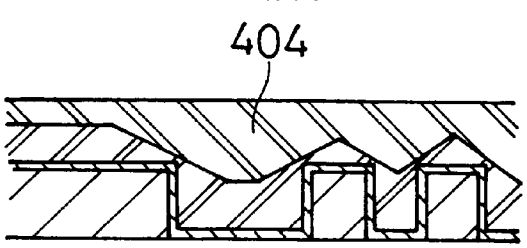
Figure 4C:
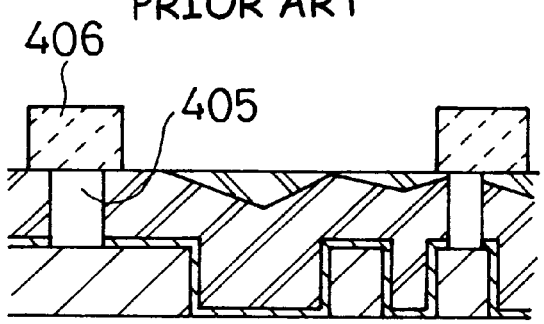
Figure 4:
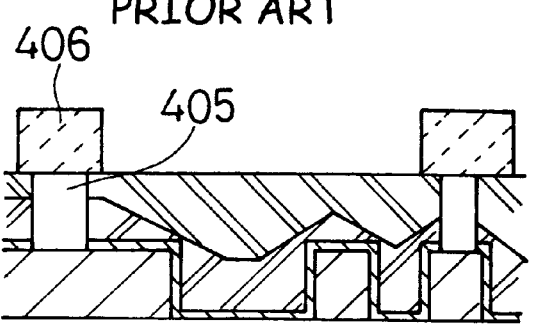
Figure 5:
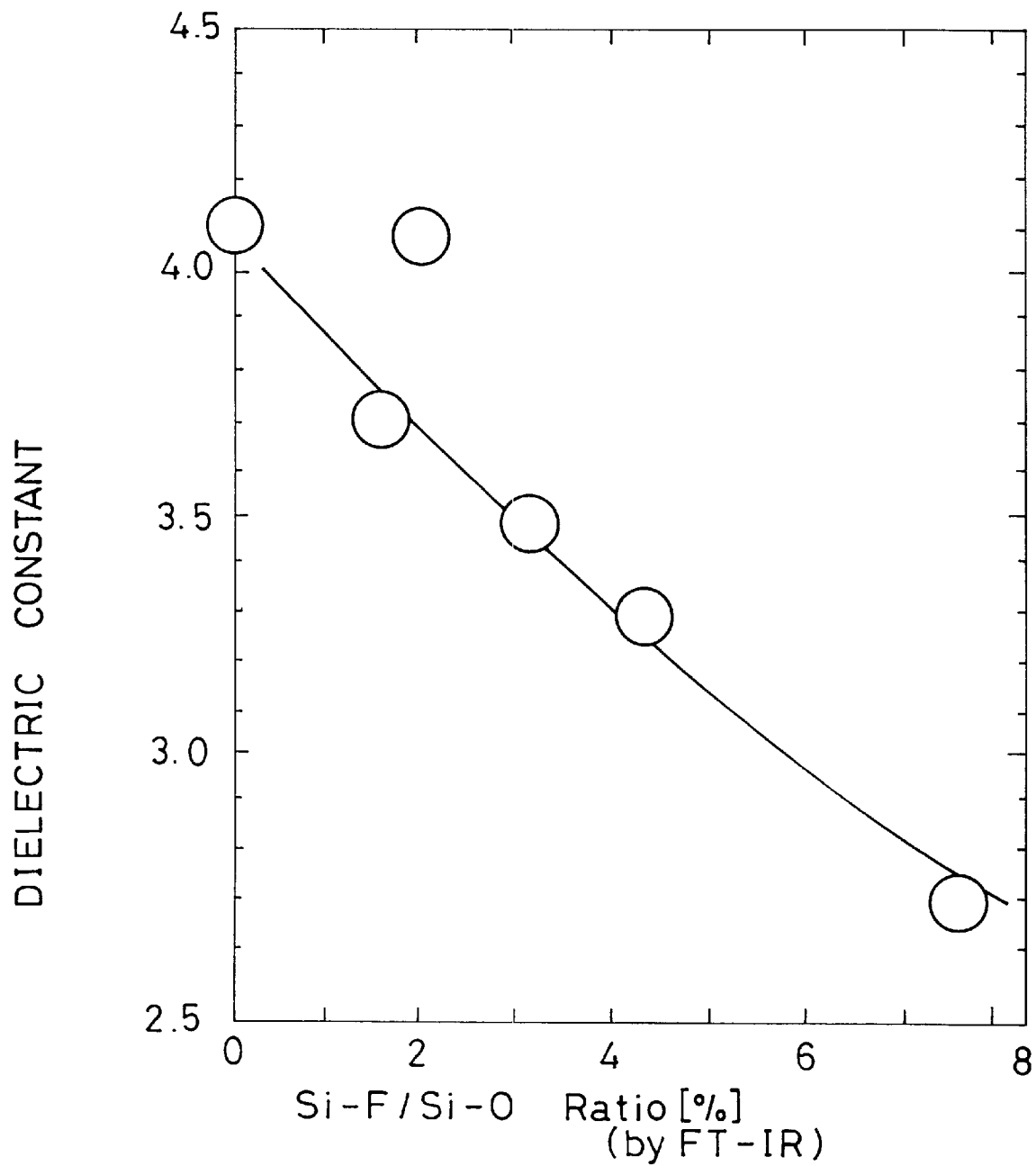
FIG. 5 shows the relationship between fluorine content in a fluorine doped silicon oxide film and dielectric constant.

Afterward, continuous sputtering of a second metal 207 of, for example, AlCu—TiN was carried out, and this metal was patterned through a photoresist. This serial procedure was carried out one or more times to form multilayer interconnections as shown in FIG. 2(c).

The second embodiment has just been described above, but in the first and second embodiments, the continuous sputtering is used for the first metal and the second metal, but as an additive for Al, there may be used Si, Pd or Ti, in addition to Cu. Moreover, in place of Al, there may be used Cu or Ag. Moreover, TiN is used to prevent reflection, but Ti, TiW, Cr or Si may be used. Additionally, as the via metal, W-CVD/TiN is used, but W of the via may be replaced with Ag, Cu or Al. As the barrier metal, Ti, TiW, Si and Cr may be used singly or in a combination of two or more thereof. Examples of the usable gas for forming the p-SiOF film include SiH$_4$+O$_2$+Ar+CF$_4$, SiH$_4$+O$_2$+Ar+C$_2$F$_6$, SiH$_4$+O$_2$+Ar+NF$_3$, SiF$_4$+O$_2$+Ar, SiF$_4$+SiH$_4$+O$_2$+Ar, TEOS+O$_2$+Ar+CF$_4$, TEOS+O$_2$+Ar+C$_2$F$_6$, TEOS+O$_2$+Ar+NF$_3$, TEFS (fluorotriethoxysilane; the same shall apply hereinafter)+O$_2$+Ar, TEFS+SiH$_4$+O$_2$+Ar and TEFS+SiF$_4$+Ar+O$_2$, and these gas mixtures from which Ar is omitted may also be used. For the improvement of burying properties, Ar may be replaced with Xe, and the kinds of gases which are used in the first layer and the second layer may be replaced with each other. For example, SiF$_4$+Ar+O$_2$ may be used for the first layer, and SiF$_4$+SiH$_4$+Ar+O$_2$ may be used for the second layer.

Furthermore, the p-SiOF is preferably formed by CVD from a parallel plate using a frequency of 13.56 MHz, CVD from a parallel plate using two frequencies of 13.56 MHz and 400 MHz, bias ECR-CVD using a high frequency of 2.45 GHz and a bias of 13.56 MHz, ICPCVD of 2.45 GHz and 13.56 MHz, and helicon CVD, but high density plasma CVD methods such as bias ECR-CVD, ICP-CVD and helicon DVD method are more preferable.

Moreover, in order to completely eliminate hygroscopicity of the SiOF film after CMP, a heat treatment at 300 to 450° C. may be additionally carried out after CMP. This treatment may be done in an atmosphere of one or a combination of O$_2$, N$_2$, H2, He or air, or in vacuo.

The thicknesses of SiO$_2$ and SiOF are conveniently set for the description of the above embodiments, but if the second SiOF alone is processed by CMP processing, a combination of different thicknesses may be employed.

The second p-SiOF film may be formed in the form of a multi-layer film, provided that a fluorine concentration is in the range of less than 4.0×10$^{21}$ atoms/cc. In addition, if the fluorine concentration is 4.0×10$^{21}$ atoms/cc or more in a part of the wafer of the first p-SiOF layer instead of all of the wafer, the advantages of the present invention can be obtained, and therefore such an embodiment is also covered in the scope of the present invention.

Furthermore, the fluorine concentration of the second p-SiOF film is limited to less than 4.0×10$^{21}$ atoms/cc, but a film having a concentration of this value or more can be used only in a region from which all of the second p-SiOF film is removed.

According to the method of the present invention, the dielectric constant of the first fluorine doped silicon oxide film is 3.3 or less, preferably 3.2 or less, and its lower limit is 2.8, preferably 2.9. Moreover, the dielectric constant of the second fluorine doped silicon oxide film is more than 3.3, preferably 3.4 or more, and its upper limit is 4.1, preferably 3.9.

According to the method of the present invention, the fluorine concentration of the first fluorine doped silicon oxide film is 4×10$^{21}$ atoms/cc or more, preferably 6×10$^{21}$ atoms/cc or more, and its upper limit is 1.0 K 1022 atoms/cc, preferably 8×10$^{21}$ atoms/cc.

Moreover, fluorine concentration of the second fluorine doped silicon oxide film is less than 4×10$^{21}$ atoms/cc, preferably less than 2×10$^{21}$ atoms/cc, and its lower limit is 1.0×10$^{20}$ atoms/cc.

In this embodiment, the dielectric constant of the first fluorine doped silicon oxide film is 3.0, and that of the second fluorine doped silicon oxide film is 3.5.

Furthermore, in the first and second embodiments, the etch back is carried out after the blanket WCVD, but metal CMP may be employed. In addition, W-CVD may be employed. Moreover, O$_2$ plasma processing may be carried out for the improvement of wettability before CMP of the p-SiOF film and CMP of the metal.

Furthermore, lamination of p-SiOF/p-SiO$_2$ in the second embodiment is preferably carried out in a continuous growth manner for the improvement of the burying properties particularly in the case of a bias high density plasma CVD method.

Advantages of the present invention are as follows.

A first advantage is that even when p-SiOF films are subjected to CMP processing, a low dielectric constant film between metal layers can be formed, because the p-SiOF films themselves have moisture resistance. This reason is that the two or more p-SiOF films are formed and the fluorine concentration of an upper layer which is exposed to a CMP processing is controlled to less than 4.0×10$^{21}$ atoms/cc to maintain moisture resistance.

A second advantage is that even when an SiO$_2$/SiOF/SiO$_2$ structure is formed, a relatively small capacitance between the metal layers results. This reason is that when a two SiOF layers/SiO$_2$ structure is formed and CMP processing is then carried out, followed by the formation of SiO$_2$, moisture does not invade the film between the metal layers in which the SiO$_2$ layer as an upper layer is oriented in an X direction.

What is claimed is:

1. A semiconductor device which comprises a plurality of interconnections formed on a semiconductor substrate, a first fluorine doped silicon oxide discrete film having a dielectric constant of 3.3 or less for completely filling up spaces between the plurality of interconnections and fully burying the interconnections therein, and a second fluorine doped silicon oxide discrete film having a dielectric constant in excess of 3.3 formed on the first fluorine doped silicon oxide film and having a flattened planar surface and which is free from hygroscopicity; said first film having a thickness of approximately 5000 Å, said second film having a thickness of approximately 10000 Å.

2. The semiconductor device according to claim 1 wherein a fluorine concentration of the first fluorine doped silicon oxide is 4.0×10$^{21}$ atoms/cc or more.

3. The semiconductor device according to claim 1 wherein a fluorine concentration of the second fluorine doped silicon oxide is less than $4.0 \times 10^{21}$ atoms/cc.

4. A semiconductor device with comprises a plurality of inteconnections formed on a semiconductor substrate, a first silicon oxide discrete film formed on the interconnections, a first fluorine doped silicon oxide discrete film having a dielectric constant of 3.3 or less formed on the first silicon oxide film, said first silicon oxide film and said first fluorine doped silicon oxide film completely filling up spaces between said plurality of interconnections and fully burying the interconnections therein, a second fluorine doped silicon oxide discrete film having a dielectric constant in excess of 3.3 formed on the first fluorine doped silicon oxide film and having a flattened planar surface which is free from hygroscopicity, and a second silicon oxide film formed on the second fluorine doped silicon oxide film; said second fluorine doped film having a thickness approximately twice the thickness of said first fluorine doped film.

5. The semiconductor device according to claim 4 wherein a fluorine concentration of the first fluorine doped silicon oxide is $4.0 \times 10^{21}$ atoms/cc or more.

6. The semiconductor device according to claim 4 wherein a fluorine concentration of the second fluorine doped silicon oxide is less than $4.0 \times 10^{21}$ atoms/cc.

* * * * *